United States Patent
Salter et al.

(10) Patent No.: US 8,878,438 B2
(45) Date of Patent: Nov. 4, 2014

(54) LAMP AND PROXIMITY SWITCH ASSEMBLY AND METHOD

(75) Inventors: Stuart C. Salter, White Lake, MI (US); Cornel Lewis Gardner, Romulus, MI (US); Jeffrey Singer, Canton, MI (US); Pietro Buttolo, Dearborn Heights, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 508 days.

(21) Appl. No.: 13/289,002

(22) Filed: Nov. 4, 2011

(65) Prior Publication Data
US 2013/0113397 A1     May 9, 2013

(51) Int. Cl.
| | |
|---|---|
| H05B 37/02 | (2006.01) |
| G01R 27/00 | (2006.01) |
| B60Q 3/02 | (2006.01) |
| F21V 23/04 | (2006.01) |
| H03K 17/955 | (2006.01) |
| H03K 17/18 | (2006.01) |
| H05B 37/00 | (2006.01) |
| H05B 33/08 | (2006.01) |

(52) U.S. Cl.
CPC ............... *B60Q 3/02* (2013.01); *B60Q 3/0296* (2013.01); *F21V 23/04* (2013.01); *H03K 17/955* (2013.01); *H03K 17/18* (2013.01); *H05B 37/00* (2013.01); *H05B 33/0803* (2013.01); *H05B 37/0227* (2013.01); *F21V 23/0471* (2013.01); *H03K 2217/960785* (2013.01)
USPC ............ 315/149; 315/155; 324/686; 362/490

(58) Field of Classification Search
CPC ........ G01R 27/00; G01R 27/02; H05B 37/00; H05B 37/02; H05B 33/00; H05B 33/02; H05B 33/08; H05B 33/0833; H05B 33/0842; H05B 33/0896
USPC .................. 362/488, 490; 324/686; 315/149, 315/150–152, 154, 153, 155, 159, 76, 77, 315/80
See application file for complete search history.

(56) References Cited

U.S. PATENT DOCUMENTS

| | | | |
|---|---|---|---|
| 3,382,588 | A | 5/1968 | Serrell et al. |
| 3,544,804 | A | 12/1970 | Gaumer et al. |

(Continued)

FOREIGN PATENT DOCUMENTS

| | | |
|---|---|---|
| DE | 4024052 | 1/1992 |
| EP | 1152443 | 11/2001 |

(Continued)

OTHER PUBLICATIONS

U.S. Appl. No. 13/609,390, filed Sep. 11, 2012, entitled "Proximity Switch Based Door Latch Release," (14 pages of specification and 4 pages of drawings) and Official Filing Receipt (3 pages).

(Continued)

*Primary Examiner* — David H Vu
(74) *Attorney, Agent, or Firm* — Vichit Chea; Price Heneveld LLP

(57) ABSTRACT

A lamp and proximity assembly is provided that includes a lens having a transparent window and a light source disposed to illuminate light through the transparent window of the lens. The lamp and proximity assembly further includes a proximity switch having one or more proximity sensors disposed near a perimeter of the transparent window of the lens and generating an activation field proximate to the transparent field of the lens to sense activation of the proximity switch to control activation of the light source.

19 Claims, 5 Drawing Sheets

(56) References Cited

U.S. PATENT DOCUMENTS

| | | |
|---|---|---|
| 3,691,396 A | 9/1972 | Hinrichs |
| 3,707,671 A | 12/1972 | Morrow et al. |
| 3,826,979 A | 7/1974 | Steinmann |
| 4,204,204 A | 5/1980 | Pitstick |
| 4,205,325 A | 5/1980 | Haygood et al. |
| 4,232,289 A | 11/1980 | Daniel |
| 4,257,117 A | 3/1981 | Besson |
| 4,290,052 A | 9/1981 | Eichelberger et al. |
| 4,340,813 A | 7/1982 | Sauer |
| 4,374,381 A | 2/1983 | Ng et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,825,352 A | 10/1998 | Bisset et al. |
| 5,864,105 A | 1/1999 | Andrews |
| 5,867,111 A | 2/1999 | Caldwell et al. |
| 5,874,672 A | 2/1999 | Gerardi et al. |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,537,359 B1 | 3/2003 | Spa |
| 6,559,902 B1 | 5/2003 | Kusuda et al. |
| 6,587,097 B1 | 7/2003 | Aufderheide et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,652,777 B2 | 11/2003 | Rapp et al. |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |

(56) References Cited

U.S. PATENT DOCUMENTS

| | | |
|---|---|---|
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 | 8/2007 | Schmidt et al. |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,454,181 B2 | 6/2013 | Salter et al. |
| 8,508,487 B2 | 8/2013 | Schwesig et al. |
| 8,575,949 B2 | 11/2013 | Salter et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0122554 A1 | 7/2003 | Karray et al. |
| 2004/0056753 A1 | 3/2004 | Chiang et al. |
| 2004/0145613 A1 | 7/2004 | Stavely et al. |
| 2004/0160072 A1 | 8/2004 | Carter et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0052429 A1 | 3/2005 | Philipp |
| 2005/0068712 A1 | 3/2005 | Schulz et al. |
| 2005/0088417 A1 | 4/2005 | Mulligan |
| 2005/0110769 A1 | 5/2005 | DaCosta et al. |
| 2005/0137765 A1 | 6/2005 | Hein et al. |
| 2005/0242923 A1 | 11/2005 | Pearson et al. |
| 2005/0275567 A1 | 12/2005 | DePue et al. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0082545 A1 | 4/2006 | Choquet et al. |
| 2006/0244733 A1 | 11/2006 | Geaghan |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0225043 A1 | 9/2009 | Rosener |

(56) References Cited

U.S. PATENT DOCUMENTS

| | | |
|---|---|---|
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0309616 A1 | 12/2009 | Klinghult et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1* | 8/2010 | Salter et al. ................ 156/221 |
| 2010/0214253 A1 | 8/2010 | Wu et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0169758 A1 | 7/2011 | Aono |
| 2011/0187492 A1 | 8/2011 | Newman et al. |
| 2011/0279276 A1 | 11/2011 | Newham |
| 2011/0279409 A1 | 11/2011 | Salaverry et al. |
| 2012/0007821 A1 | 1/2012 | Zaliva |
| 2012/0037485 A1 | 2/2012 | Sitarski |
| 2012/0043976 A1 | 2/2012 | Bokma et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0154324 A1 | 6/2012 | Wright et al. |
| 2012/0217147 A1 | 8/2012 | Porter et al. |
| 2012/0312676 A1 | 12/2012 | Salter et al. |
| 2012/0313648 A1 | 12/2012 | Salter et al. |
| 2013/0036529 A1 | 2/2013 | Salter et al. |
| 2013/0076121 A1 | 3/2013 | Salter et al. |
| 2013/0093500 A1 | 4/2013 | Bruwer |
| 2013/0113544 A1 | 5/2013 | Salter et al. |
| 2013/0126325 A1 | 5/2013 | Curtis et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| EP | 2133777 B1 | 10/2011 |
| GB | 2071338 A | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 A | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |

(56) References Cited

FOREIGN PATENT DOCUMENTS

| WO | 2009054592 | | 4/2009 |
| --- | --- | --- | --- |
| WO | 2010111362 | | 9/2010 |
| WO | 2012032318 | | 3/2012 |
| WO | 2012032318 | A1 | 3/2012 |
| WO | 2012169106 | | 12/2012 |
| WO | 2012169106 | A1 | 12/2012 |

OTHER PUBLICATIONS

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

Van Ess, Dave et al., "Capacitive Touch Switches for Automotive Applications," 7 pages, Published in Automotive DesignLine, www.automotiedesignline.com, Feb. 2006.

"Introduction to Touch Solutions, White Paper, Rivision 1.0 A," Densitron Corporation, 14 pages, Aug. 21, 2007.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

NXP Capacitive Sensors, 1 page, www.nxp.com, copyrighted 2006-2010, NXP Semiconductors.

"Moisture Immunity in QuickSense Studio," AN552, Rev. 0.1 Oct. 2010, 8 pages, Silicon Laboratories, Inc., © 2010.

"Clevios P Formulation Guide," 12 pages, www.clevios.com, Heraeus Clevios GmbH, no date provided.

"Charge-Transfer Sensing-Based Touch Controls Facilitate Creative Interfaces," www.ferret.com.au, 2 pages, Jan. 18, 2006.

"Orgacon EL-P3000, Screen printing Ink Series 3000," 2 pages, AGFA, last updated in Feb. 2006.

"Touch Sensors Design Guide" by Atmel, 10620 D-AT42-04/09, Revised Apr. 2009, 72 pages, Copyrighted 2008-2009 Atmel Corporation.

\* cited by examiner

LAMP AND PROXIMITY SWITCH ASSEMBLY AND METHOD

FIELD OF THE INVENTION

The present invention generally relates to lamps and switches therefor, and more particularly relates to a lamp assembly having a proximity switch.

BACKGROUND OF THE INVENTION

Automotive vehicles are typically equipped with various user actuatable switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Automotive lamp assemblies typically include a separate mechanical switch for activating the lighting device. Some lamp assemblies include a depressible lamp assembly that moves to activate a push switch to turn the light on and off. With the availability of proximity switches, a proximity switch may be employed to control activation of the light device. It would be desirable to provide for a proximity switch and lamp assembly which is easy to package and use and does not interfere with the lighting function.

SUMMARY OF THE INVENTION

According to one aspect of the present invention, a lamp and proximity switch assembly is provided. The lamp and proximity switch assembly includes a lens having a transparent window and a light source disposed to illuminate light through the transparent window. The lamp and proximity switch assembly also includes a proximity switch comprising one or more proximity sensors disposed near a perimeter of the transparent window and generating an activation field proximate to the transparent window to sense activation of the proximity switch to control activation of the light source.

According to another aspect of the present invention, a method of controlling a lamp with a proximity switch is provided. The method includes the steps of providing a lens having a transparent window and providing a proximity switch disposed about a perimeter of the transparent window. The method also includes the step of generating an activation field proximate to the transparent window with the proximity switch. The method further includes the step of controlling activation of a light source to illuminate light through the transparent window in response to activation of the proximity switch.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
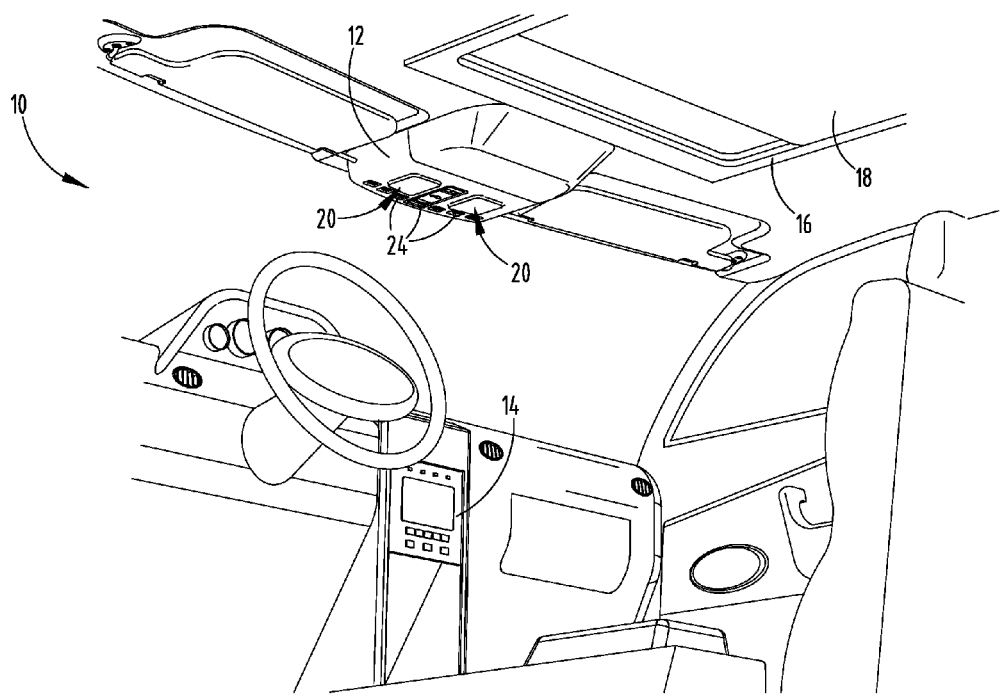
FIG. 1 is a perspective view of a passenger compartment of an automotive vehicle having an overhead console employing a pair of lamp and proximity switch assemblies, according to one embodiment.
Figure 2:
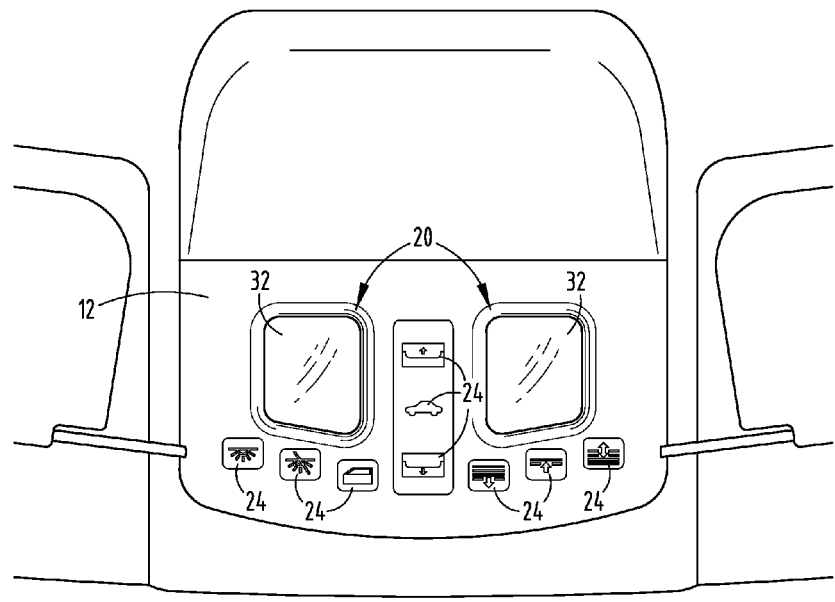
FIG. 2 is an enlarged view of the overhead console and lamp and proximity switch assemblies shown in FIG. 1.

Referring to FIGS. 1 and 2, the passenger compartment interior of an automotive vehicle 10 is generally illustrated having a pair of lamp and switch assemblies 20 and a plurality of proximity switches 24 assembled in an overhead console 12, according to one embodiment. The vehicle 10 generally includes the overhead console 12 assembled to the headliner on the underside of the roof or ceiling at the top of the vehicle passenger compartment, generally above the front passenger seating area. Each of the pair of lamp and switch assemblies 20 provides an integral assembly of a lamp and a proximity switch for activating a light source to turn the lamp on and off. Each lamp and proximity switch assembly 20 includes a lens having a light transparent window, a light source disposed behind the lens to illuminate light through the transparent window of the lens, and a proximity switch having one or more proximity sensors disposed near a perimeter of the transparent window of the lens and generating an activation field proximate to the transparent field of the lens to sense activation of the proximity switch to control activation of the light source.

A user may activate the light source by activating the proximity switch integrally provided with the lamp and switch assembly 20. The lamp may serve as an interior map or reading lamp to provide interior lighting to the vehicle 10, according to one embodiment. The lamp and switch assembly 20 may also serve as a dome lamp to provide lighting in the interior of the vehicle 10. It should be appreciated that the lamp may serve to provide lighting to the interior of the vehicle for other uses and the lamp and switch assembly 20 may be located elsewhere on the vehicle 10. For example, the lamp and switch assembly 20 may be located in the headliner, a visor, a grab handle, a center console, or elsewhere on the vehicle 10.

The proximity switch provided in each lamp and switch assembly 20 is shown and described herein as a capacitive switch, according to one embodiment. Each proximity switch includes one or more proximity sensors that provide a sense activation field to sense contact or close proximity of an object, such as a user's finger, in close relation to the one or more proximity sensors, such as a tap or swiping motion by a user's finger. Thus, the sense activation field generated by the proximity sensor of each proximity switch is a capacitive field in the exemplary embodiment, and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

A plurality of proximity switches 24 are also shown arranged close to one another in the overhead console 12. The various proximity switches 24 may control any of a number of vehicle devices and functions, such as controlling movement of a sunroof or moonroof 16, controlling movement of a moonroof shade 18, controlling activation of one or more lighting devices, and controlling various other devices and functions. However, it should be appreciated that the proximity switches 24 may be located elsewhere on the vehicle 10, such as in the dash panel, on other consoles such as a center console, integrated into a touch screen display for a radio or infotainment system such as a navigation and/or audio display, or located elsewhere onboard the vehicle 10 according to various vehicle applications.

The proximity switches 24 are shown and described herein as capacitive switches, according to one embodiment. Each proximity switch 24 includes one or more proximity sensors that provide a sense activation field to sense contact or close proximity of a user in close relation on to the one or more proximity sensors, such as a tap or swiping motion by a user's finger. Thus, the sense activation field of each proximity switch 24 is a capacitive field in the exemplary embodiment and the user's finger has electrical conductivity and dielectric properties that cause a change or disturbance in the sense activation field as should be evident to those skilled in the art.

Figure 3:
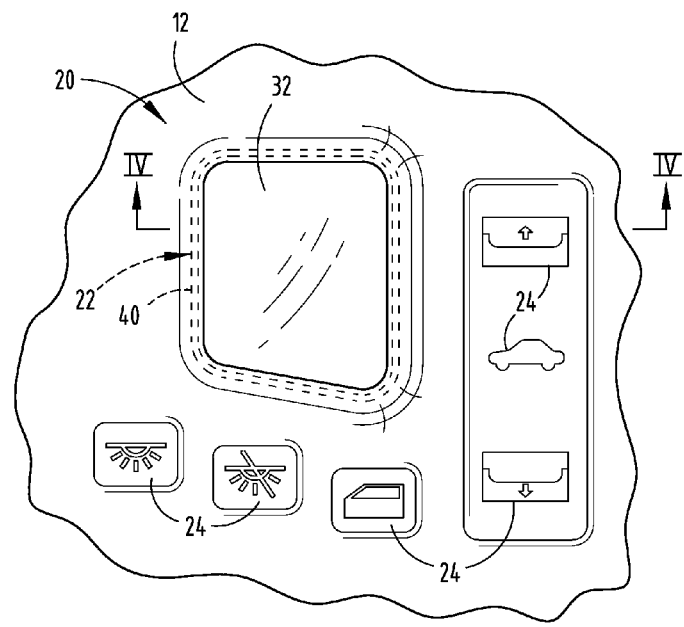
FIG. 3 is an enlarged view of one lamp and proximity switch assembly having a proximity switch arrangement, according to one embodiment.
Figure 4:
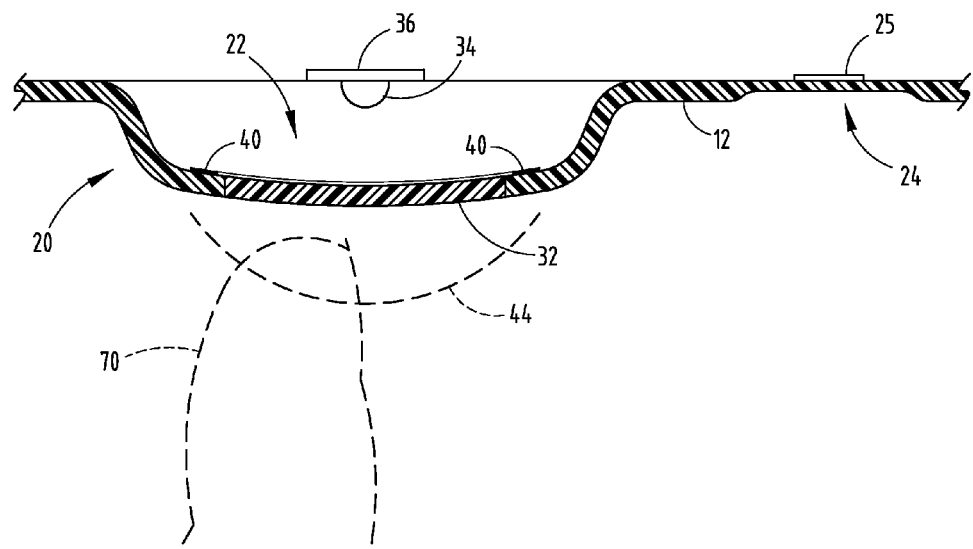
FIG. 4 is a cross-sectional view taken through line IV-IV of FIG. 3 illustrating the lamp and switch assembly in relation to a user's finger.

Referring to FIGS. 3 and 4, the lamp and switch assembly 20 is generally illustrated having a lens 32 made of a transparent material integrally molded as part of the overhead console 12. The transparent window 32 of the lens is light transmissive to allow visible light waves to pass through the transparent window 32. A lamp or light source 34 is disposed above the transparent window of the lens 32 to illuminate light through the transparent window 32 of the lens. The light source 34 may include a light emitting diode (LED) mounted to a circuit board 36, according to one embodiment. Other light sources such as an incandescent bulb or combination of one or more light sources may be employed, according to other embodiments. The lens 32 may be integrally formed as part of the overhead console 12 and having the transparent window formed therein, according to one embodiment. In this embodiment, the transparent window 32 may be molded as part of or into a polymeric material forming the overhead console 12. According to other embodiments, the lens 32 may be formed as a separate component and assembled to the overhead console 12. In such embodiments, the lens 32 may be fixedly mounted to the overhead console 12 via fasteners, adhesive or other mounting connection and generally does not move relative to the overhead console 12.

The lamp and proximity switch assembly 20 includes a proximity switch 22 disposed near a perimeter of the transparent window 32 of the lens. The proximity switch 22 has one or more proximity sensors 40 for generating an activation field 44 proximate to the transparent window 32 to sense activation of the proximity switch 22 to control activation of the light source 34. In the embodiment shown, the proximity switch 22 having a single proximity sensor 40 configured to substantially surround the transparent window 32 of the lens. In this embodiment, the proximity switch 22 substantially surrounds the lens 32 to generate an activation field 44 generally across substantially the entire bottom surface of the lens 32 as seen in FIG. 4.

According to one embodiment, the proximity sensor 40 is applied as a conductive ink onto a substrate shown as the upper side of the overhead console 12 about the perimeter of the lens 32. The conductive ink forms electrodes that serve to provide a capacitance which produces the activation field 44. It should be appreciated that other forms of capacitive sensors may be employed to generate the activation field 44. It should be appreciated that the activation field 44 generated by the proximity switch 22 extends below the transparent window 32 of the lens to enable an object, such as a user's finger 70, hand or other body part to enter the activation field 44 to activate the light source 34 on and off. When an object, such as finger 70 sufficiently engages the activation field 44, a disturbance in the activation field 44 is detected such that activation of the switch is initiated so as to either switch the light source 34 on or switch the light source 34 off.

It should be appreciated that the activation field 44 is generally constrained to the area below the transparent window 32 of the lens such that it does not interfere with adjacent proximity switches 24. The proximity switches 24 are shown assembled to the overhead console 12 near the lamp assembly 20. The proximity switches 24 each have a proximity sensor 25 that may be formed as a conductive ink applied onto a substrate such as the upper surface of the polymeric overhead console 12. It should be appreciated that proximity sensor 25 may be otherwise formed as a pre-assembled pad. The proximity switches 24 are disposed at a distance sufficiently away from the lamp and switch assembly 20.

Figure 5:
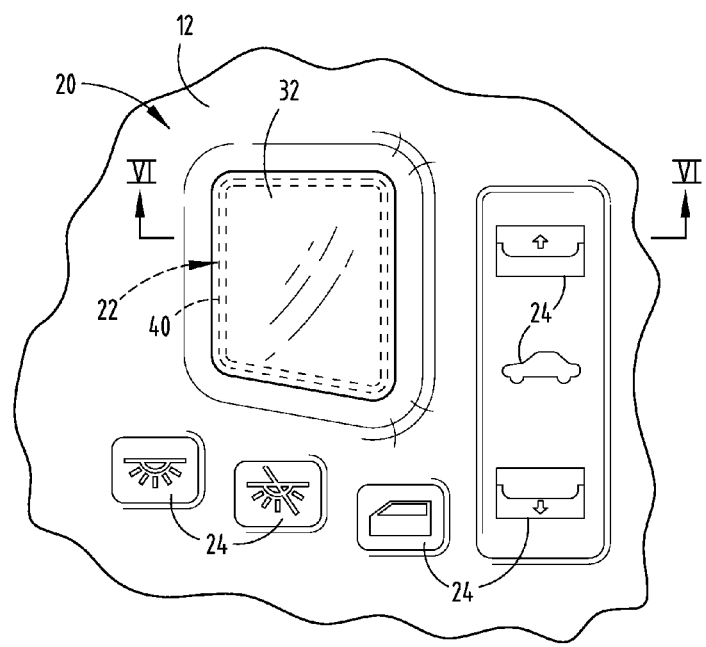
FIG. 5 is a front view of a lamp and switch assembly having an alternate switch arrangement, according to another embodiment.
Figure 6:
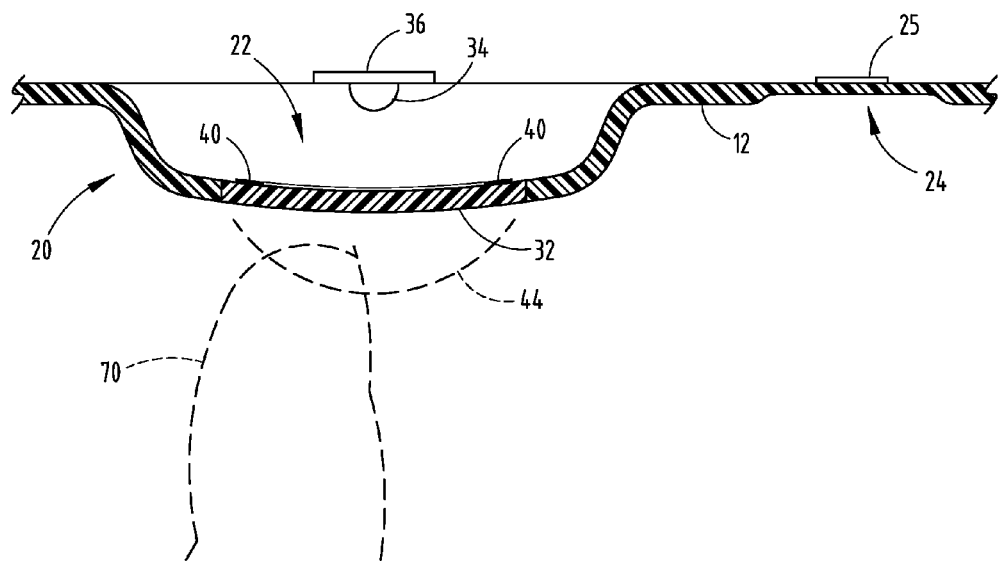
FIG. 6 is a cross-sectional view taken through line VI-VI of FIG. 5 showing the lamp and switch assembly in relation to a user's finger.

Referring to FIGS. 5 and 6, a lamp and switch assembly 20 is illustrated according to another embodiment in which the proximity switch 22 is disposed within an area of the lens, near a perimeter of a transparent window 32 of the lens that does not interfere with the light transmission path from the light source 34 through the lens. In this embodiment, the proximity switch 22 is provided within the lens, as opposed to surrounding the perimeter of the lens. The light source 34 is disposed above the transparent window 32 of the lens to illuminate light through the transparent window of the lens 32. By mounting the proximity switch 40 on the lens, but outside of the transparent window 32, an integrally formed lens and proximity switch may be provided. The proximity switch 22 has a proximity sensor 40 that generates an activation field 44 in the region below the transparent window of the lens 32 to enable an object, such as a user's finger 70 or other body part, to activate the switch to turn the light source 34 on and off.

Figure 7:
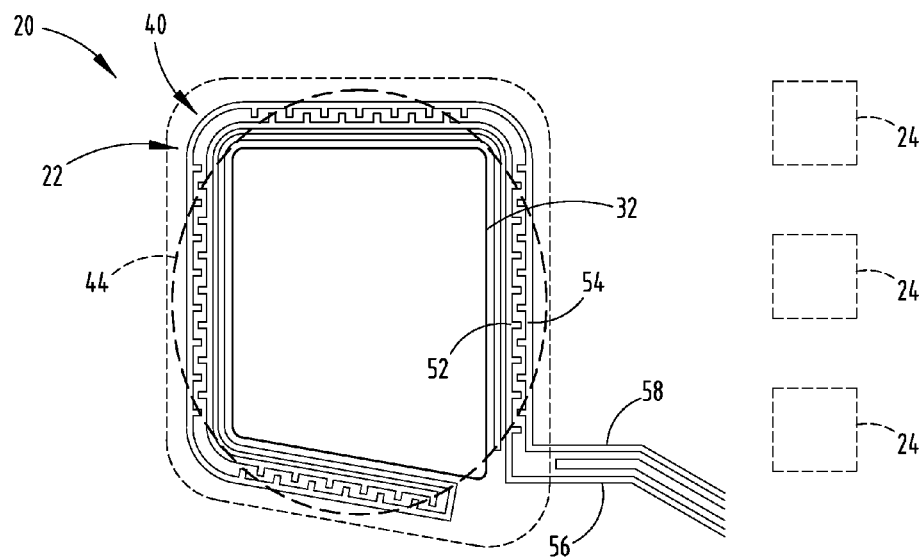
FIG. 7 is a front view of the lamp and switch assembly and proximity switch circuitry of the single proximity switch embodiment shown in FIG. 5.

Referring to FIG. 7, the single proximity switch and lamp assembly and associated circuitry are illustrated, according to the single sensor arrangement of the first embodiment. First and second conductive lines 56 and 58 provide electrical signals to first and second interdigitated capacitive fingers 52 and 54 which generate the capacitance for the activation field 44. First conductive line 56 may receive a pulsed drive signal while second conductive line 58 outputs a voltage proportional to the capacitance. The interdigitated capacitive fingers 52 and 54 form a capacitive sensor 40 that extends substantially around the perimeter of the transparent window 32 of the lens so as to provide an activation field 44 that substantially covers the transparent window 32 of the lens. The capacitive sensor 40 may be provided as a conductive pad formed using a conductive ink.

Figure 8:
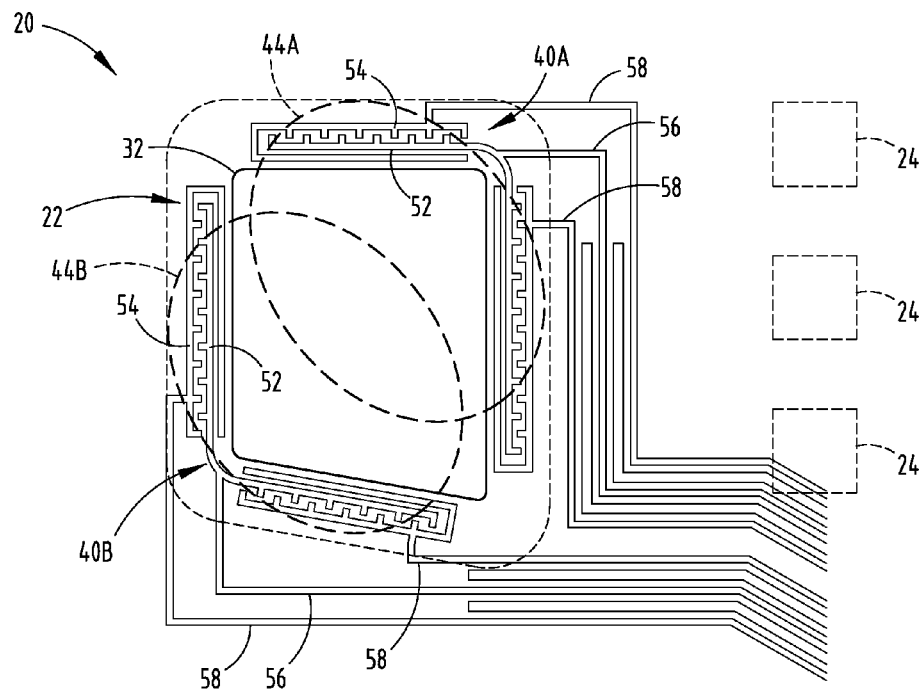
FIG. 8 is a front view of a lamp and proximity switch assembly and proximity switch circuitry employing two proximity sensors, according to a second embodiment.

Referring to FIG. 8, a lamp and proximity switch assembly 20 is illustrated having two proximity switch sensors 40A and 40B, according to a second embodiment. In this embodiment, the first proximity switch sensor 40A is provided by electrodes 52 and 54 on one side of the transparent window 32 of the lens, while the second capacitive switch sensor 40B is provided by electrodes 52 and 54 on an opposite second side of the transparent window 32 of the lens. Each of the electrodes 52 and 54 is fed electrical signals from conductive lines 56 and 58 to generate capacitance. The first and second capacitive sensors 40A and 40B generate activation fields 44A and 44B, respectively. The capacitive sensors 40A and 40B may be formed as pads onto the lens, bezel or overhead console 12. The activation fields 44A and 44B may be generated in a desired pattern in an area substantially directed towards a center of the transparent window 32 of the lens. Activation of the proximity switch may occur when a user's finger or other object sufficiently enters one or both of the activation fields 44A and 44B. According to one embodiment, the switch assembly 20 may be configured to activate the lamp only when an object sufficiently enters both of the first and second activation fields 44A and 44B, thereby requiring that the object be applied in a region near the center of the transparent window 32 of the lamp.

Figure 9:
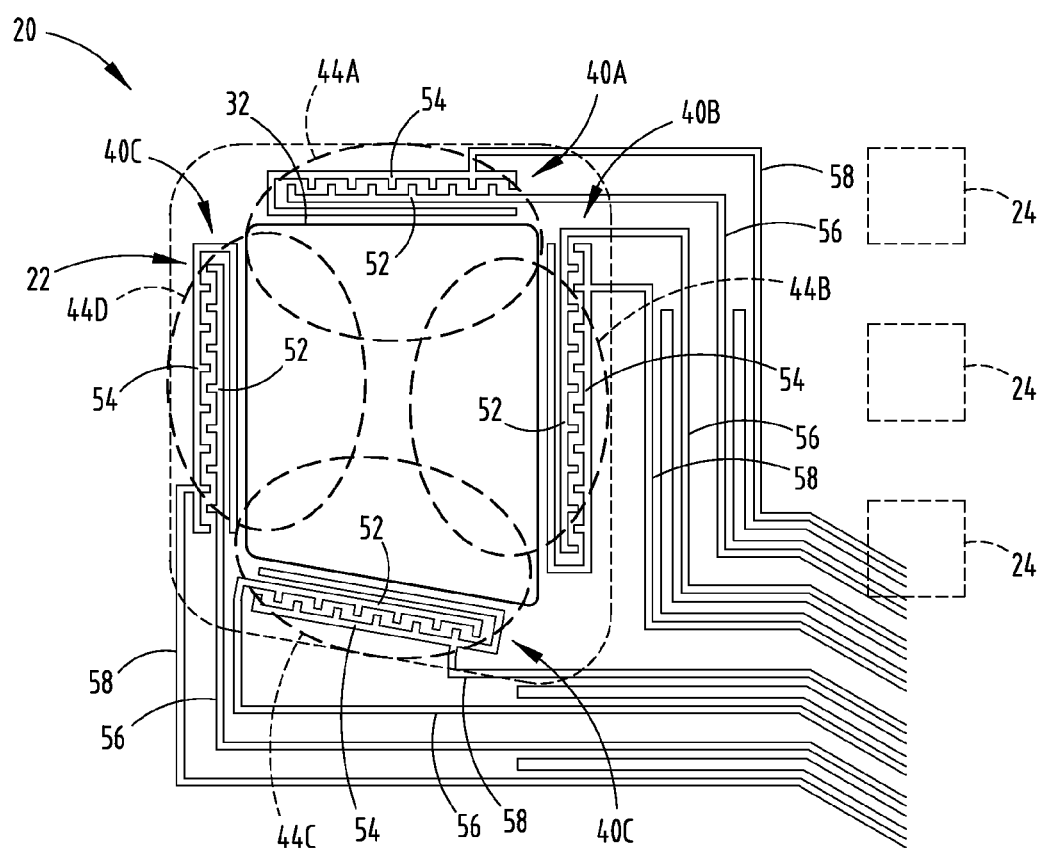
FIG. 9 is a front view of a lamp and proximity switch assembly and proximity switch circuitry employing four proximity sensors, according to a third embodiment.

Referring to FIG. 9, a lamp and proximity switch assembly 20 is illustrated according to a third embodiment employing four proximity switch sensors 40A-40D. The proximity sensors 40A-40D generate four activation fields 44A-44D, respectively in different quadrants of the transparent window 32 of the lens. Each of the activation fields 44A-44D may be generated to extend substantially towards the center of the transparent lens. As a result, the four activation fields 44A-44D substantially cover the transparent window 32 of the lens. By employing four sensor pads, enhanced flexibility is provided to tune the proximity sensors 40A-40D and thus the proximity switch 22 switches to avoid inadvertent actuations. For example, when further capacitive switches, such as switches 24 are located near the lens 32, the burst length of the charge signal applied to the adjacent sensors, such as sensor 40B may be adjusted to shorten the burst length to give a lessened measureable signal, while sensors not in close proximity to other switches may be increased in the signal burst length to give increased measurable signals thereby generating the activation field away from the adjacent switches 24. This has the effect of reducing the inadvertent actuations by lowering sensitivity of one or more sensors on the side closer to the other switches 24 for providing enough sensitivity to provide coverage to the entire lens 32. It should be appreciated that other means of adjusting the intensity or shape of the activation field(s) may be achieved to provide the desired activation signal without interference to adjacent switches 24.

Accordingly, the lamp and proximity switch assembly 20 advantageously provides for an integral proximity switch and lamp arrangement that is easy to use, particularly in an automotive vehicle. The proximity switch may easily be activated by contact or close proximity of an object, such as user's finger in relation to the proximity switch to turn a lamp on and off. The arrangement of the proximity switch around the perimeter of the transparent window of the lens allows for a transparent window to be free of switch assembly material in a cost-effective manner.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A lamp and proximity switch assembly comprising:
a lens having a transparent window;
a light source disposed to illuminate light through the transparent window of the lens; and
a proximity switch comprising one or more proximity sensors substantially surrounding or disposed on a perimeter of the transparent window and generating an activation field proximate to the transparent window to sense activation of the proximity switch to control activation of the light source.

2. The assembly of claim 1, wherein the one or more proximity sensors are disposed substantially surrounding the perimeter of the transparent window.

3. The assembly of claim 1, wherein the one or more proximity sensors comprises first and second proximity sensors generating first and second activation fields, wherein the first and second activation fields overlap.

4. The assembly of claim 3, wherein control of the light source occurs when both the first and second activation fields are activated.

5. The assembly of claim 1, wherein the assembly is employed on a vehicle.

6. The assembly of claim 1, wherein the one or more proximity sensors comprise one or more capacitive sensors.

7. The assembly of claim 1, wherein the light source comprises an LED.

8. The assembly of claim 1, wherein the one or more proximity sensors comprises a plurality of proximity sensors disposed substantially around the perimeter of the lens.

9. The assembly of claim 8, wherein each of the plurality of proximity sensors are individually controlled so as to control the activation field output of each of the proximity sensors.

10. A method of controlling a lamp with a proximity switch assembly, said method comprising:
providing a lens having a transparent window;
providing a proximity switch substantially surrounding or disposed on a perimeter of the transparent window;
generating an activation field proximate to the transparent window with the proximity switch; and
controlling activation of a light source to illuminate light through the transparent window of the lens in response to activation of the proximity switch.

11. The method of claim 10, wherein the step of providing the proximity switch comprises providing one or more proximity sensors substantially surrounding the perimeter of the transparent window.

12. The method of claim 10, wherein the step of providing a proximity switch comprises providing first and second proximity sensors generating first and second activation fields, wherein the first and second activation fields overlap.

13. The method of claim 12, wherein the control of the light source occurs when both the first and second activation fields are activated.

14. The method of claim 10, wherein the step of providing a proximity switch comprises providing a plurality of proximity sensors disposed substantially around the perimeter of the lens.

15. The method of claim 14 further comprising the step of individually controlling the activation field output of each of the proximity sensors.

16. The method of claim 10, wherein the assembly is employed on a vehicle.

17. The method of claim 10, wherein the proximity switch comprises a capacitive switch.

18. The method of claim 10, wherein the light source comprises an LED.

19. The method of claim 10, wherein the step of providing a proximity switch comprises applying a conductive ink onto a substrate to form a proximity sensor.

\* \* \* \* \*